US012685103B2

(12) United States Patent
van der Straten et al.

(10) Patent No.: US 12,685,103 B2
(45) Date of Patent: Jul. 14, 2026

(54) METAL WIRES WITH EXPANDED SIDEWALLS

(71) Applicant: INTERNATIONAL BUSINESS MACHINES CORPORATION, Armonk, NY (US)

(72) Inventors: Oscar van der Straten, Guilderland Center, NY (US); Willie Lester Muchrison, Jr., Troy, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 484 days.

(21) Appl. No.: 18/190,175

(22) Filed: Mar. 27, 2023

(65) Prior Publication Data

US 2024/0332074 A1     Oct. 3, 2024

(51) Int. Cl.
*H10W 20/00*     (2026.01)
*H10W 20/41*     (2026.01)

(52) U.S. Cl.
CPC ....... *H10W 20/033* (2026.01); *H10W 20/057* (2026.01); *H10W 20/076* (2026.01); *H10W 20/425* (2026.01)

(58) Field of Classification Search
CPC ............. H01L 23/5283; H01L 23/5226; H01L 23/53266; H01L 23/53295; H01L 21/76877; H01L 21/76843; H01L 21/76831; H01L 21/76879; H10W 20/033; H10W 20/425; H10W 20/057; H10W 20/076; H10W 72/234
See application file for complete search history.

(56) References Cited

U.S. PATENT DOCUMENTS

| | | | |
|---|---|---|---|
| 3,648,131 A | 3/1972 | Stuby | |
| 6,400,172 B1 * | 6/2002 | Akram | H01L 21/76898 |
| | | | 257/E21.597 |
| 6,469,394 B1 * | 10/2002 | Wong | H01L 24/16 |
| | | | 257/E21.511 |
| 7,811,919 B2 | 10/2010 | Daley | |
| 9,418,889 B2 | 8/2016 | Mountsier | |
| 9,502,350 B1 * | 11/2016 | Bonilla | H01L 23/53228 |
| 9,613,853 B2 | 4/2017 | Chen | |
| 9,824,989 B2 | 11/2017 | Shih | |

(Continued)

OTHER PUBLICATIONS

Starten et al. "Wiring Structure for Advanced Interconnect", Pending U.S. Appl. No. 18/179,421, filed Mar. 7, 2023, 35 pages.

*Primary Examiner* — John M Parker
(74) *Attorney, Agent, or Firm* — L. Jeffrey Kelly

(57)     ABSTRACT

A semiconductor structure including a homogeneous interconnect structure embedded in a dielectric layer, where the homogeneous interconnect structure includes a third region vertically aligned above a second region vertically aligned above a first region, the third region includes three sections: an upper section including a first width; a middle section including an upper horizontal surface including the first width and a lower horizontal surface including a second width; and a lower section including the second width; where the first width is less than the second width; and the second region including a third width at an upper horizontal surface of the second region and a fourth width at a lower horizontal surface of the second region, where the third width is greater than the fourth width.

19 Claims, 19 Drawing Sheets

100

(56) References Cited

U.S. PATENT DOCUMENTS

| | | | | |
|---|---|---|---|---|
| 10,256,186 B2 * | 4/2019 | Bonilla | H01L 21/76877 | |
| 10,468,334 B2 * | 11/2019 | Kume | H01L 24/06 | |
| 11,107,731 B1 * | 8/2021 | Xie | H01L 23/5226 | |
| 11,114,395 B2 | 9/2021 | Lin | | |
| 11,205,618 B2 * | 12/2021 | Yang | H01L 21/76876 | |
| 11,315,799 B2 | 4/2022 | Xie et al. | | |
| 11,315,827 B2 | 4/2022 | Huang et al. | | |
| 2008/0174012 A1 * | 7/2008 | Otsuki | H01L 24/97 | |
| | | | 438/114 | |
| 2010/0052164 A1 * | 3/2010 | Lee | H01L 24/05 | |
| | | | 257/738 | |
| 2010/0164121 A1 * | 7/2010 | Feustel | H01L 21/76804 | |
| | | | 257/E23.145 | |
| 2010/0197133 A1 * | 8/2010 | Werner | H01L 21/0337 | |
| | | | 257/E21.586 | |
| 2013/0280879 A1 * | 10/2013 | Stecher | H01L 21/31144 | |
| | | | 257/E21.022 | |
| 2016/0049330 A1 * | 2/2016 | Peng | H01L 21/76885 | |
| | | | 257/774 | |
| 2016/0071766 A1 | 3/2016 | Barth | | |
| 2018/0076133 A1 | 3/2018 | Bonilla et al. | | |
| 2021/0351079 A1 | 11/2021 | Su | | |
| 2021/0375802 A1 | 12/2021 | Lin | | |
| 2021/0391421 A1 | 12/2021 | Chu | | |
| 2022/0139833 A1 | 5/2022 | Chen et al. | | |
| 2022/0157714 A1 | 5/2022 | Sio et al. | | |
| 2022/0223473 A1 | 7/2022 | Anderson et al. | | |
| 2022/0230939 A1 | 7/2022 | Shih | | |
| 2024/0113018 A1 * | 4/2024 | van der Straten | | |
| | | | H01L 21/76885 | |
| 2024/0304546 A1 | 9/2024 | Van Der Straten et al. | | |
| 2024/0304547 A1 | 9/2024 | Van Der Straten et al. | | |
| 2024/0421076 A1 * | 12/2024 | van der Straten | | |
| | | | H01L 21/76843 | |
| 2025/0014994 A1 * | 1/2025 | van der Straten | | |
| | | | H01L 23/53266 | |

* cited by examiner

100

METAL WIRES WITH EXPANDED SIDEWALLS

BACKGROUND

The present invention generally relates to semiconductor structures, and more particularly to metal wires with expanded sidewalls.

Back end of line (BEOL) is the portion of integrated circuit fabrication where the individual devices (transistors, capacitors, resisters, etc.) get interconnected with one or more metallization layers. The BEOL generally begins immediately above the front-end-of-line region which contains the devices themselves. In general, the BEOL includes contacts, insulating layers (dielectrics), metal levels, and bonding sites for chip-to-package connections and wiring for metal lines. Fabricating the metal lines in the BEOL has become increasingly difficult as the demand for space continues to increase with the advent of smaller technology nodes. It is particularly challenging to form tight pitched metal lines without consequentially increasing line resistance.

SUMMARY

According to an embodiment of the present invention, a semiconductor structure is provided. The semiconductor structure may include a homogeneous interconnect structure embedded in a dielectric layer, where the homogeneous interconnect structure includes a third region vertically aligned above a second region vertically aligned above a first region, the third region includes a first width at an upper horizontal surface of the third region and a second width at a lower horizontal surface of the third region, where the first width is less than the second width, and the second region includes a third width at an upper horizontal surface of the second region and a fourth width at a lower horizontal surface of the second region, where the third width is greater than the fourth width.

According to an embodiment of the present invention, a semiconductor structure is provided. The semiconductor structure may include a homogeneous interconnect structure embedded in a dielectric layer, where the homogeneous interconnect structure includes a third region vertically aligned above a second region vertically aligned above a first region, the third region includes three sections: an upper section including a first width; a middle section including an upper horizontal surface including the first width and a lower horizontal surface including a second width; and a lower section including the second width; where the first width is less than the second width; and the second region including a third width at an upper horizontal surface of the second region and a fourth width at a lower horizontal surface of the second region, where the third width is greater than the fourth width.

According to an embodiment of the present invention, a semiconductor structure is provided. The semiconductor structure may include a set of homogeneous interconnect structures embedded in a dielectric layer with a pitch less than 30 nm, where the set of homogeneous interconnect structures each include a third region vertically aligned above a second region vertically aligned above a first region, the third region includes a first width at an upper horizontal surface of the third region and a second width at a lower horizontal surface of the third region, where the first width is less than the second width, and the second region includes a third width at an upper horizontal surface of the second region and a fourth width at a lower horizontal surface of the second region, where the third width is greater than the fourth width.

BRIEF DESCRIPTION OF THE DRAWINGS

The following detailed description, given by way of example and not intended to limit the invention solely thereto, will best be appreciated in conjunction with the accompanying drawings, in which.

Figure 1:
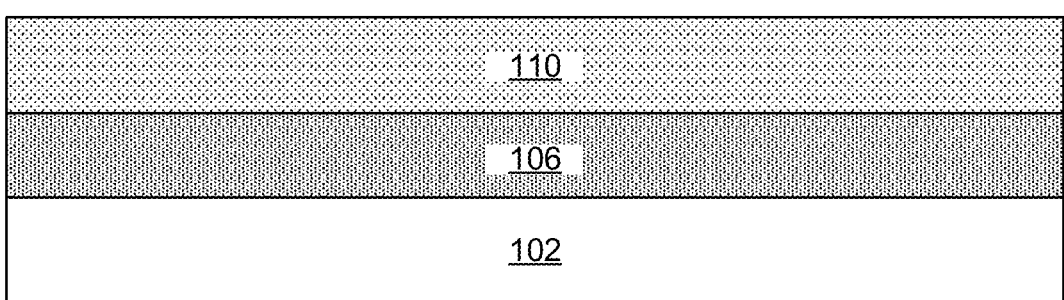
FIG. 1 is a cross-sectional view of a structure shown during an intermediate step of fabrication, according to an embodiment of the invention.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Advanced transistor structures have known advantages over conventional transistor structures in terms of density, performance, power consumption, and integration. Fabricating the metal lines in the back-end-of-line (BEOL) has become increasingly difficult as the demand for space continues to increase with the advent of smaller technology nodes. For example, it is particularly challenging to form tight pitched metal lines without consequentially increasing line resistance. Moreover, for BEOL pitch below 30 nm, R/C delay is growing unsustainably large and there is a need to fill minimum critical dimension (CD) lines with alternative metals other than copper, for example ruthenium, to achieve lower line resistance; however, doing so can result in dielectric line wiggling. Dielectric line wiggling describes a phenomenon in which straight metal lines are not relatively straight. Dielectric line wiggle occurs when stresses from the metal fill, specifically metals other than copper, physically distort the surrounding dielectric. Dielectric line wiggle is especially problematic in designs with relatively high aspect ratios and pitches less than 30 nm. Excessive wiggle can cause shorts, bridging, and unplanned breaks in the subsequently formed metal lines. For purposes of this description, and all embodiments described herein, typical line pitch is less than 30 nm.

The present invention generally relates to semiconductor structures, and more particularly to metal wires with expanded sidewalls. The interconnect structure and associated method disclosed herein enables a novel solution for providing a high aspect ratio lines with low resistance interconnect structure due to a locally wider metal CD, and an improved metal fill due to a low aspect ratio. Metal wires with expanded sidewalls provide a uniform height and line profile. The metal wires may have a different low-k dielectric surrounding an upper section/a central section/and a lower section of the metal wire.

In an embodiment, a lower portion of a central wire section may have a sidewall angle 30 to 50 degrees compared to the lower wire section. An upper portion of the central wire section may have a sidewall angle of −30 to −50 degrees compared to the upper wire section.

In an alternate embodiment, a central wire section may have an octagon profile. A lower portion of a central wire section may have a sidewall angle 30 to 45 degrees compared to the lower wire section. A middle portion of the central wire section may have straight sides and an upper portion of the central wire section may have a sidewall angle of −30 to −45 degrees compared to the upper wire section.

Exemplary embodiments of metal wires with expanded sidewalls are described in detail below by referring to the accompanying drawings in FIGS. 1 to 19. Those skilled in the art will readily appreciate that the detailed description given herein with respect to these figures is for explanatory purposes as the invention extends beyond these limited embodiments.

Referring now to FIG. 1, a structure 100 is shown during an intermediate step of a method of fabricating a transistor structure according to an embodiment of the invention. The structure 100 may include a substrate 102, a first dielectric layer 106 and a second dielectric layer 110. The structure 100 may be formed or provided.

The substrate 102 may include a bulk semiconductor or a layered semiconductor such as Si/SiGe, a silicon-on-insulator (SOI), or a SiGe-on-insulator (SGOI). Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In other embodiments, the substrate 102 may represent a device region, such as the front-end-of-line, or a prior metallization level in the back-end-of-line, such as $M_{x-1}$. In some cases, the substrate 102 may generally be referred to as a wafer.

The first dielectric layer 106 may be formed directly on the substrate 102. The second dielectric layer 110 may be formed directly on the first dielectric layer 106.

According to embodiments of the present invention, the first dielectric layer 106 may include any suitable dielectric material such as silicon based low-k dielectrics, or porous dielectrics. For example, the first dielectric layer 106 may include organic polymer low-k dielectrics and SiCOH-based low-k dielectrics (such as SiCOH, SiCNOH) including selective low-k dielectric deposition.

In an embodiment, the first dielectric layer 106 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. In some embodiments, a planarization technique such as, for example, chemical mechanical planarization (CMP) and/or grinding is applied after deposition. In other embodiments, no polishing or griding of the first dielectric layer 106 is performed. In yet another embodiment, the first dielectric layer 106 may include a self-planarizing material such as a spin-on glass (SOG) or a spin-on low-K dielectric material such as SiLK™. Doing so may avoid the need to perform a subsequent planarizing step. SiLK™ is a trademark of The Dow Chemical Company.

The first dielectric layer 106 may have a typical thickness ranging from about 30 nm to about 100 nm and ranges there between, although a thickness less than 30 nm and greater than 100 nm are explicitly contemplated. It is noted the typical thickness of the first dielectric layer 106, at this stage of fabrication, is less than the typical thickness of a conventional dielectric layer deposited in the middle-of-line or back-end-of-line. For example, according to embodiments of the present invention, the typical thickness of the first dielectric layer 106, at this stage of fabrication, is approximately only 30% of the typical thickness of a conventional dielectric layer deposited in the middle-of-line or back-end-of-line. As such, for exemplary purposes only, if the typical thickness of a conventional dielectric layer deposited in the middle-of-line or back-end-of-line were approximately 100 nm, the typical thickness of the first dielectric layer 106, at this stage of fabrication, is approximately 30 nm.

The second dielectric layer 110 may be formed directly on the first dielectric layer 106. The second dielectric layer 110 may be formed of a material and as described for the first dielectric layer 106.

In an embodiment, the second dielectric layer 110 may include a different dielectric material as the first dielectric layer 106. In an alternate embodiment, the second dielectric layer 110 may include the same or similar dielectric material as the first dielectric layer 106.

The second dielectric layer 110 may have a typical thickness ranging from about 30 nm to about 100 nm and ranges there between, although a thickness less than 30 nm and greater than 100 nm are explicitly contemplated. Similar to the first dielectric layer 106, it is noted the typical thickness of the second dielectric layer 110, at this stage of fabrication, is less than the typical thickness of a conventional dielectric layer deposited in the middle-of-line or back-end-of-line. For example, according to embodiments of the present invention, the typical thickness of the second dielectric layer 110, at this stage of fabrication, is approximately only 30% of the typical thickness of a conventional dielectric layer deposited in the middle-of-line or back-end-of-line. As such, for exemplary purposes only, if the typical thickness of a conventional dielectric layer deposited in the middle-of-line or back-end-of-line were approximately 100 nm, the typical thickness of the second dielectric layer 110, at this stage of fabrication, is approximately 30 nm.

Figure 2:
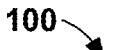
FIG. 2 is a cross-sectional view of the structure and illustrate patterning a second dielectric layer, according to an embodiment of the invention.
Figure 2:
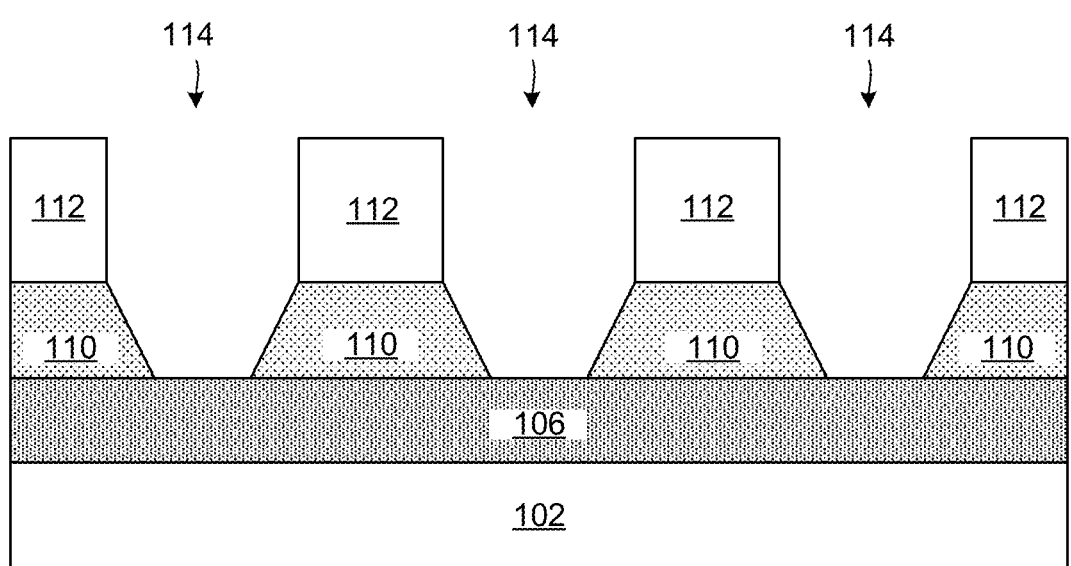

Referring now to FIG. 2 the structure 100 is shown according to an embodiment of the invention. A mask 112 may be formed. Portions of the second dielectric layer 110 may be removed, forming trenches 114.

The mask 112 may include well known photoresist materials, for example, a soft mask, and could be either positive or negative in tone. Optionally, a non-contact or a hard mask may also be used. In an embodiment, the second dielectric layer 110 may be of a different material allowing removal of the second dielectric layer 110 selective to the first dielectric layer 106.

The mask 112 is created by first depositing a photoresist material directly above the second dielectric layer 110 and lithographically patterning the photoresist material to form the mask 112. The photoresist material may be patterned by exposing the photoresist to a desired pattern of radiation and developing the exposed photoresist utilizing a conventional resist developer. The mask 112 or pattern in the photoresist may then be transferred to the second dielectric layer 110 using one or more dry etching techniques. Suitable dry etching techniques may include, but are not limited to: reactive ion etching (RIE), ion beam etching, plasma etching, or laser ablation. In an embodiment, a RIE technique using, for example, a chlorine based etchant including $BCl_3$, $CHCl_3$, or $Cl_2$, may be used to transfer the mask 112 pattern into the underlying dielectric layer (second dielectric layer 110).

An etching technique is applied to generally remove portions of the second dielectric layer 110 according to known techniques. Specifically, a suitable directional etching technique is used to etch exposed portions of the second dielectric layer 110 and expose topmost surfaces of the first dielectric layer 106. The object of this directional etching technique is to subsequently form individual interconnect structures having a lower profile which is negatively tapered. More specifically, the directional etching technique is applied at a very specific angle to create a very specific negative tapered profile in portions of the second dielectric layer 110 remaining above the first dielectric layer 106. Specifically, the portions of the second dielectric layer 110 remaining above the first dielectric layer 106 with a negative tapered profile have a lateral width at, or about, the topmost surface of the second dielectric layer 110 that is larger than a lateral width at a lowermost surface of the second dielectric layer 110 which is at a topmost surface of the first dielectric layer 106, as illustrated. Said differently, a sidewall angle of the negative tapered profile may range from approximately-30 degrees to approximately-50 degrees. The desired angle of the negative tapered profile is carefully chosen to maximize a width at, or about, a middle of the subsequently formed individual interconnect structures while also maintaining an acceptable distance between adjacent remaining portions of the subsequently formed individual interconnect structures.

Suitable directional etching techniques may include, but are not limited to: reactive ion etching (RIE), ion beam etching, plasma etching, or laser ablation. In an embodiment, a RIE technique using, for example, with or without including argon ion species, may be used to remove portions of second dielectric layer 110.

Removing portions of the second dielectric layer 110 selective to the mask 112 creates trenches 114 and exposes the underlying first dielectric layer 106. According to embodiments of the present invention, the trenches 114 typically correspond to designed metal features, such as, metal features or metal lines in the middle-of-line or back-end-of-line. Similarly, according to embodiments of the present invention, the trenches 114 would have a relatively small pitch, for example less than 30 nm, and a typical width of approximately 10 nm to approximately 18 nm.

Figure 3:
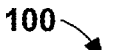
FIG. 3 is a cross-sectional view of the structure and illustrates patterning a first dielectric layer, according to an embodiment of the invention.
Figure 3:
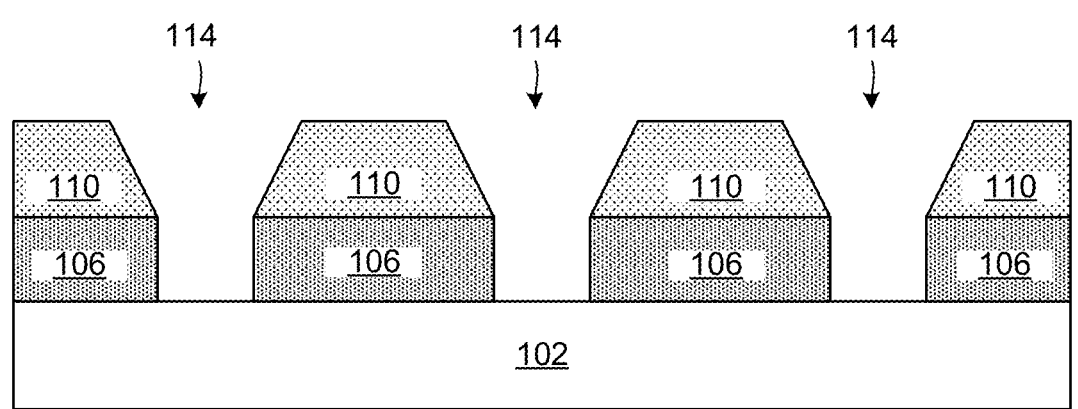

Referring now to FIG. 3, the structure 100 is shown according to an embodiment. Portions of the first dielectric layer 106 may be removed.

The portions of the first dielectric layer 106 may be removed which are vertically aligned with the lateral width at the lowermost surface of the second dielectric layer 110. An etching technique is applied to generally enlarge the trenches 114, as illustrated and according to known techniques. Specifically, a directional or isotropic dry etching technique, such as reactive ion etching, is used to etch exposed portions of the first dielectric layer 106 and further expand or enlarge the trenches 114. The object of this directional etching technique is to increase the size, or width, of the trenches 114. More specifically, the directional etching technique is applied to increase a depth of the trenches 114 and expose an upper horizontal surface of the substrate 102.

After etching, the patterned photoresist (i.e. the mask 112) is then removed by resist stripping.

Figure 4:
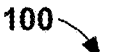
FIG. 4 is a cross-sectional view of the structure and illustrates deposition of a first barrier layer, according to an embodiment of the invention.
Figure 4:
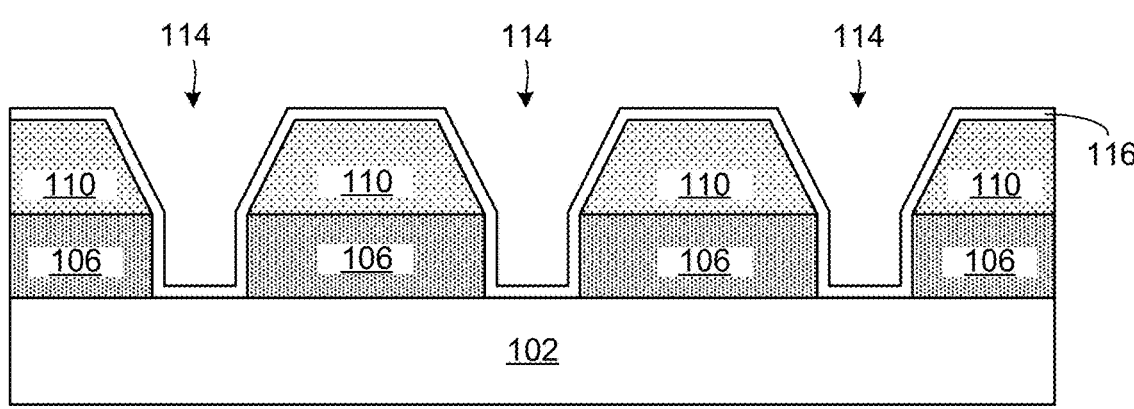

Referring now to FIG. 4, the structure 100 is shown after depositing a first barrier layer 116 according to an embodiment of the invention.

The first barrier layer 116, or nucleation layer, is formed by conformally depositing a barrier material over the structure 100 according to known techniques. Specifically, the barrier material is conformally deposited on a top and tapered sidewalls of the second dielectric layer 110, exposed sidewalls of the first dielectric layer 106, and exposed surfaces of the substrate 102, as illustrated. As used herein, "conformal" it is meant that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface.

As well known by persons having skill in the art, the first barrier layer 116 is typically applied to create a diffusion break between sidewall portions of the surrounding dielectrics (106, 112). As such, the first barrier layer 116 would be designed to prevent diffusion of any subsequently deposited conductive material into the surrounding first, second dielectric layers (106, 110). According to embodiments of the present invention, the first barrier layer 116 is composed of any known suitable barrier materials, for example, metal nitrides. In an embodiment, the first barrier layer 116 is tantalum nitride (TaN), titanium nitride (TiN), tungsten nitride (WN), boron carbon doped tungsten (WBC), or some combination thereof. In an embodiment, the first barrier layer 116 includes multiple layers for example a tantalum layer and a tantalum nitride layer. In another embodiment, the first barrier layer 116 includes a single layer of tungsten nitride (WN). In yet another embodiment, the first barrier layer 116 includes a single layer of titanium tungsten nitride (TiWN).

In an embodiment, the first barrier layer 116 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In general, the first barrier layer 116 may have a thickness sufficient to achieve desired barrier properties as is well known to persons having skill in the art. For example, the first barrier layer 116 may have a typical thickness ranging from about 1 nm to about 4 nm and ranges there between, although a thickness less than 1 nm and greater than 4 nm are explicitly contemplated.

Figure 5:
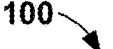
FIG. 5 is a cross-sectional view of the and illustrates deposition of a conductive material, according to an embodiment of the invention.
Figure 5:
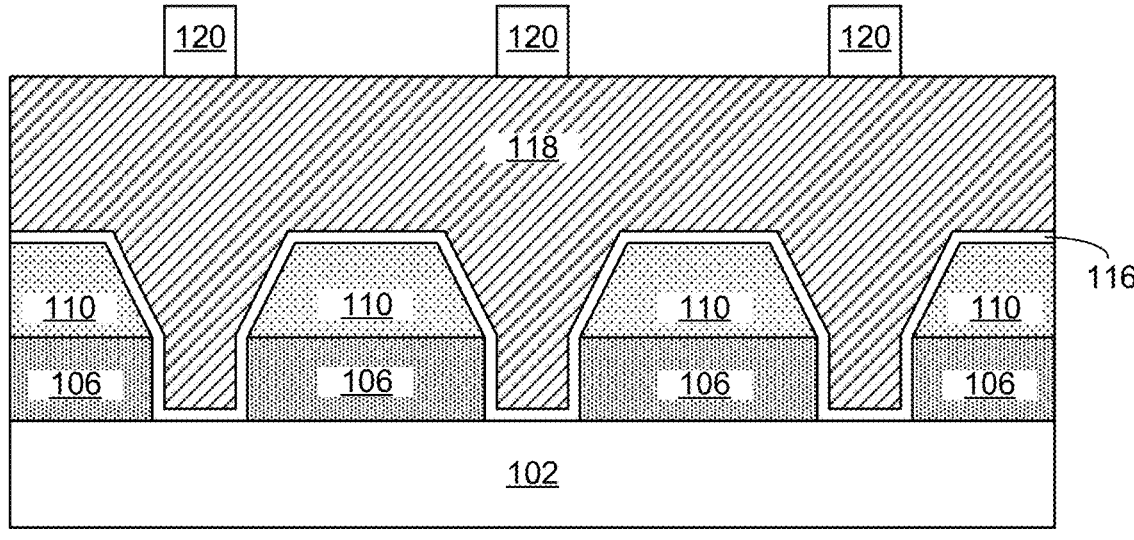

Referring now to FIG. 5, the structure 100 is shown according to an embodiment of the invention. A conductive material 118 may be deposited. A mask 120 may be formed.

The conductive material 118 is blanket deposited on the structure 100 filling the trenches 114 according to known techniques. More specifically, according to an embodiment, the conductive material 118 is blanket deposited directly on exposed surfaces of the first barrier layer 116, as illustrated.

According to embodiments of the present invention the conductive material 118 may include any suitable conductive interconnect materials such as molybdenum, tungsten, rhodium, iridium, copper, or alloys or combinations thereof. In an embodiment, the conductive material 118 is molybdenum.

The conductive material 118 may be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In general, deposition of the conductive material 118 continues until the trenches 114 are completely filled and well in excess of uppermost surface of the structure 100, as illustrated. For example, the conductive material 118 may have a typical thickness ranging from about 60 nm to about 300 nm and ranges there between, although a thickness less than 60 nm and greater than 300 nm are explicitly contemplated.

It is noted, the trenches 114, FIG. 4, have relatively low aspect ratios which permit filling with the conductive material 118 with little or no voids. For example, the aspect ratios of the trenches 114, FIG. 4, may be approximately 2:1, height to average width. Further, the relatively low aspect ratio of the trenches 114, FIG. 4, additionally significantly decreases the risk of dielectric line wiggle.

The mask 120 is formed above the conductive material 118 according to known techniques. More specifically, the mask 120 is created by first depositing a photoresist material directly above the conductive material 118 and lithographically patterning the photoresist material to form the mask 120. The photoresist material may be patterned by exposing the photoresist to a desired pattern of radiation and developing the exposed photoresist utilizing a conventional resist developer.

According to embodiments of the present invention, the mask 120 typically corresponds to designed metal features, such as, that same metal features or metal lines in the middle-of-line or back-end-of-line corresponding to the trenches 114 of FIG. 4. More specifically, the size and location of the mask 120 corresponds and aligns with the trenches 114, FIG. 4, now filled with the conductive material 118. It is preferred that the mask 120 be aligned with the trenches 114, FIG. 4; however, such alignment is not mandatory and some tolerance (1-2 nm) in alignment accuracy is acceptable.

Figure 6:
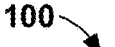
FIG. 6 is a cross-sectional view of the structure and illustrates patterning the conductive material, according to an embodiment of the invention.
Figure 6:
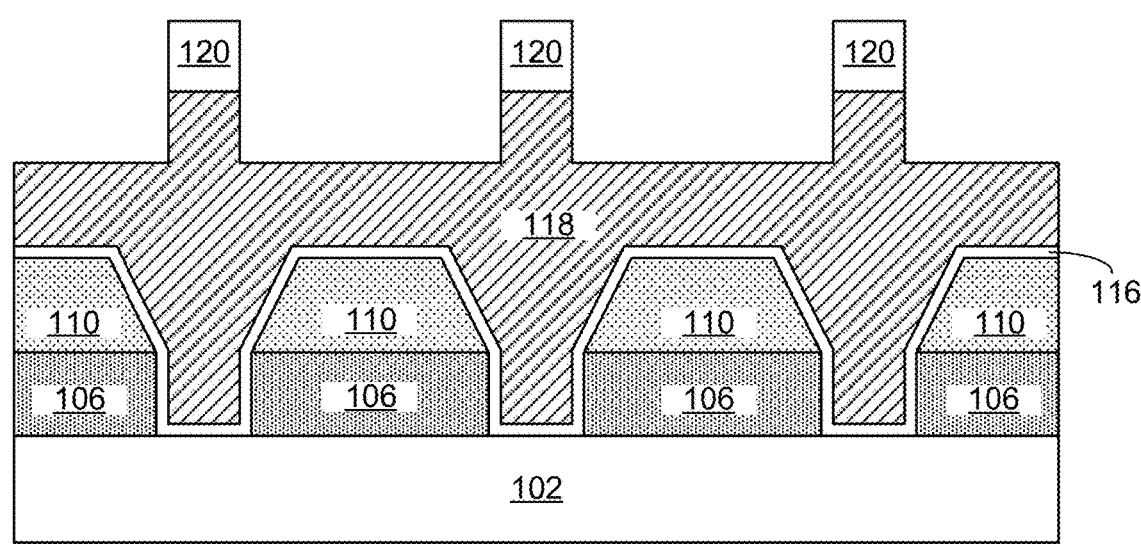

Referring now to FIG. 6, the structure 100 is shown according to an embodiment. Portions of the conductive material 118 are removed.

An etching technique is applied to generally remove portions of the conductive material 118 according to known techniques. Specifically, a suitable directional etching technique is used to etch exposed portions of the conductive material 118 and expose an upper horizontal surface of the conductive material 118.

Figure 7:
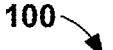
FIG. 7 is a cross-sectional view of the structure and illustrates additional patterning of the conductive material, according to an embodiment of the invention.
Figure 7:
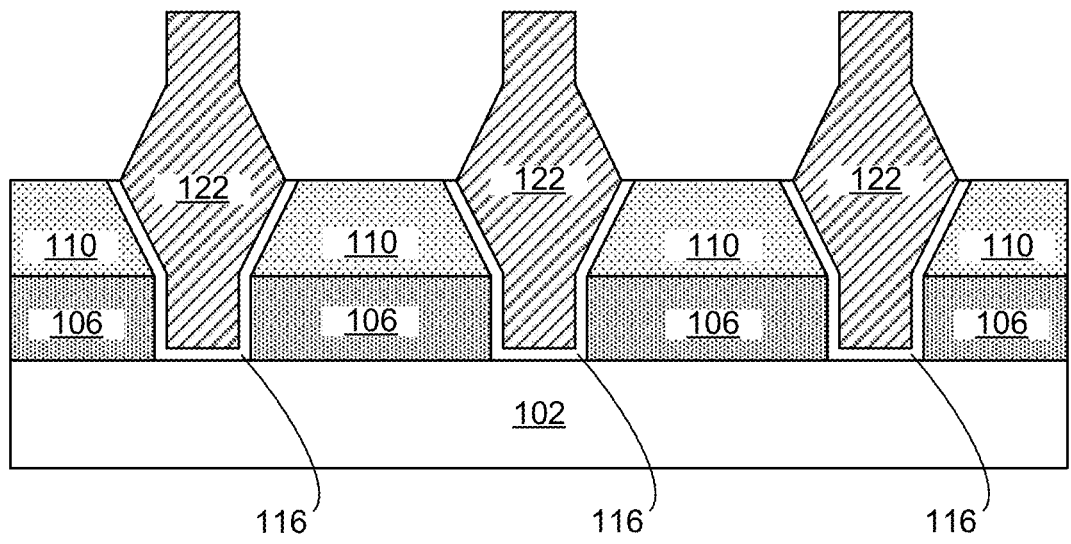

Referring now to FIG. 7, the structure 100 is shown according to an embodiment. Additional portions of the conductive material 118 are removed to form individual interconnect structures 122 from the conductive material 118. Portions of the first barrier layer 116 may be removed.

An etching technique is applied to generally remove portions of the conductive material 118 according to known techniques. Specifically, a suitable directional etching technique is used to etch exposed portions of the conductive material 118 and expose topmost surfaces of the first barrier layer 116. The object of this directional etching technique is to form individual interconnect structures 122 having an upper portion with a negatively tapered profile. More specifically, the directional etching technique is applied at a very specific angle to create a very specific negative tapered profile in portions of the conductive material 118 remaining above the second dielectric layer 110. Specifically, the portions of the conductive material 118 remaining above the second dielectric layer 110 with a negative tapered profile have a lateral width at, or about, the topmost surface of the second dielectric layer 110 that is larger than a lateral width at a topmost surface of the conductive material 118 of the individual interconnect structure 122, as illustrated. Said differently, a sidewall angle of the negative tapered profile may range from approximately –30 degrees to approximately –50 degrees. The desired angle of the negative tapered profile is carefully chosen to maximize a width at, or about, a middle of the individual interconnect structures 122 while also maintaining an acceptable distance between adjacent remaining portions of the individual interconnect structures 122.

Suitable directional etching techniques may include, but are not limited to: reactive ion etching (RIE), ion beam etching, plasma etching, or laser ablation. In an embodiment, a RIE technique using, for example, with or without including argon ion species, may be used to remove portions of the conductive material 118 and form the individual interconnect structures 122 as described above. In an alternative embodiment, an ion beam etching technique using, for example, at fixed ion beam angle corresponding to the desired taper angle of the structure, may be used to remove portions of the conductive material 118 and form the individual interconnect structures 122 as described above. In all cases, the directional etching technique shall be chosen and tailored to the specific material of the conductive material 118 in order to produce the desired negative tapered profile.

Etching is also designed to remove substantially horizontal portions of the first barrier layer 116, as illustrated. After etching, topmost surfaces of the second dielectric layer 110 are exposed, as illustrated.

The mask 120 is removed according to known techniques. For example, after etching the conductive material 118 the mask 120 is then removed by resist stripping. For purposes of the present description, the mask 120 is the same, or substantially similar, as the mask 112 previously described.

Figure 8:
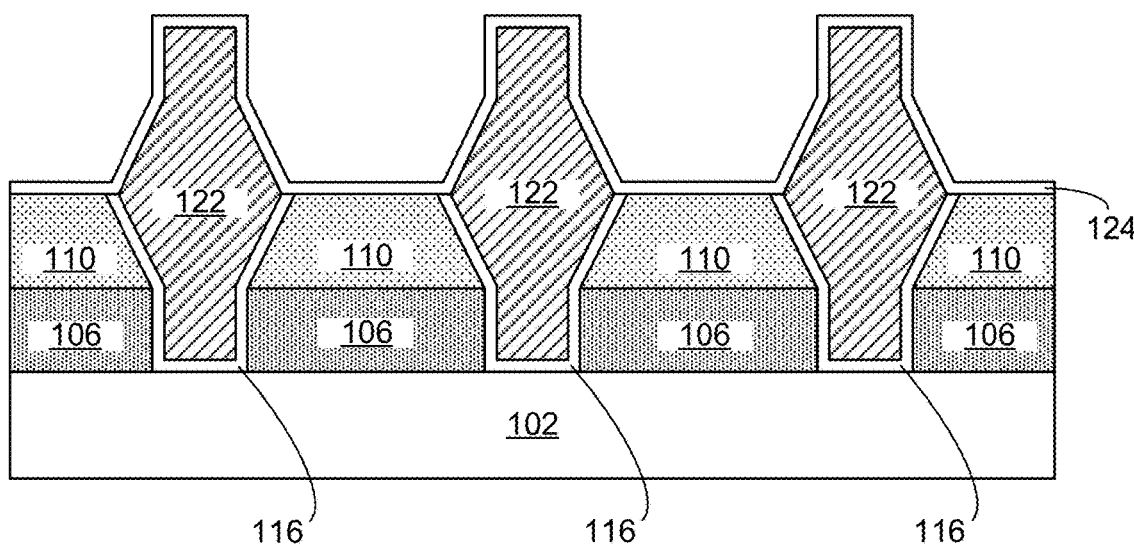
FIG. 8 is a cross-sectional view of the structure and illustrations formation of a second barrier layer, according to an embodiment of the invention.

Referring now to FIG. 8, the structure 100 is shown according to an embodiment of the invention. A second barrier layer 124 may be formed.

The second barrier layer 124, or nucleation layer, is formed by conformally depositing a barrier material over the structure 100 according to known techniques. Specifically, the barrier material is conformally deposited on a top and tapered sidewalls of the interconnect structures 122 and exposed topmost surfaces of the second dielectric layer 110, as illustrated.

As well known by persons having skill in the art, the second barrier layer 124 is typically applied to create a diffusion break between sidewall portions of subsequently formed dielectrics. As such, the second barrier layer 124 would be designed to prevent diffusion of the conductive material of the individual interconnect structures 122 into the subsequently formed dielectrics. According to embodiments of the present invention the second barrier layer 124 is composed of any known suitable barrier materials, for example, metal nitrides. In an embodiment, the second barrier layer 124 is titanium nitride (TiN), tungsten nitride (WN), tantalum nitride (TaN) boron carbon doped tungsten (WBC), or some combination thereof. In an embodiment, the second barrier layer 124 includes multiple layers for example a tantalum layer and a tantalum nitride layer. In another embodiment, the second barrier layer 124 includes a single layer of tungsten nitride (WN). In yet another embodiment, the first barrier layer 116 includes a single layer of titanium tungsten nitride (TiWN). Further, the second barrier layer 124 may be the same or different composition as the first barrier layer 116. In all cases, the barrier layers (116, 124) would preferably be chosen based on the specific surrounding materials of the first, second dielectric layers (106, 110) and the conductive material 118.

In an embodiment, the second barrier layer 124 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In general, the second barrier layer 124 may have a thickness sufficient to achieve desired barrier properties as is well known to persons having skill in the art. For example, the second barrier layer 124 may have a typical thickness ranging from about 1 nm to about 4 nm and ranges there between, although a thickness less than 1 nm and greater than 4 nm are explicitly contemplated.

Figure 9:
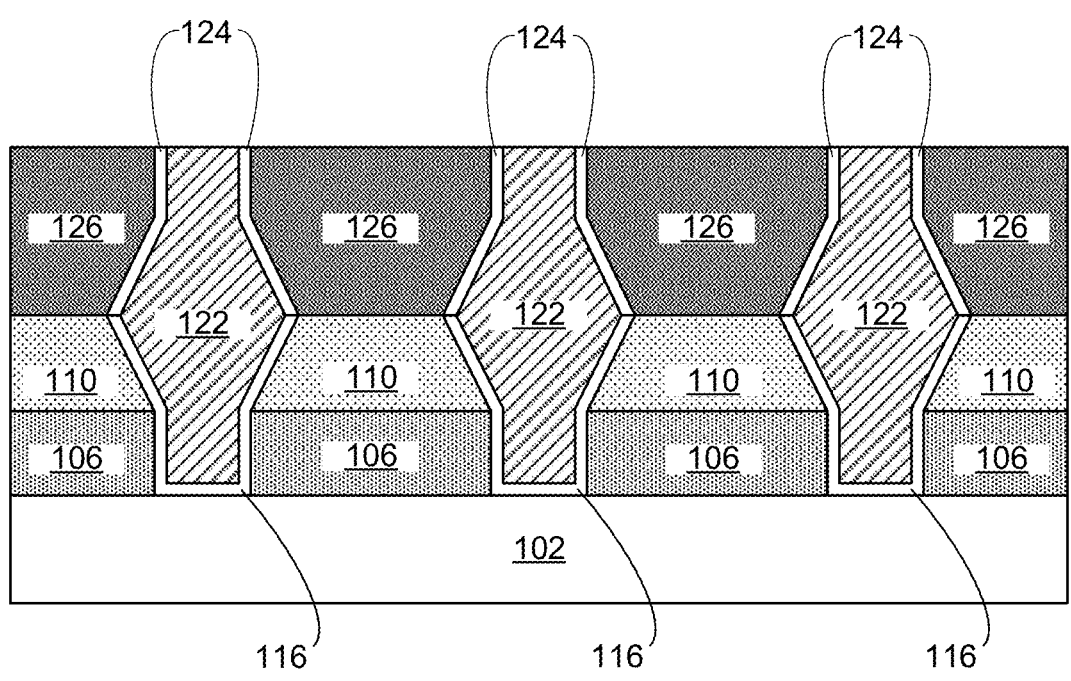
FIG. 9 is a cross-sectional view of the structure and illustrations removal of portions of the second barrier layer and deposition of a third dielectric layer, according to an embodiment of the invention.

Referring now to FIG. 9, the structure 100 is shown according to an embodiment of the invention. A portion of the second barrier layer 124 may be removed. A third dielectric layer 126 may be deposited.

An etching technique is applied to remove horizontal portions of the second barrier layer 124 according to known techniques. Specifically, one or more dry etching techniques is used to remove horizontal portions of the second barrier layer 124, as illustrated. Suitable dry etching techniques may include, but are not limited to: reactive ion etching (RIE), ion beam etching, plasma etching, or laser ablation. In all cases, the dry etching technique shall cause remaining portions of the second barrier layer 124 on the negative tapered sidewalls of the individual interconnect structures 122. The second barrier layer 124 may be removed from an upper horizontal surface of the second dielectric layer 110 and from an upper horizontal surface of the individual interconnect structure 122.

The third dielectric layer 126 is deposited on the upper surface of the second dielectric layer 110 according to known techniques. According to embodiments of the present invention, the third dielectric layer 126 may include any dielectric material compatible with known deposition techniques, such as, but not limited to, the exemplary materials listed above with respect to the first dielectric layer 106. In an embodiment, the third dielectric layer 126 may include the same or similar dielectric material as the first dielectric layer 106, the second dielectric layer 110, or both. In an alternative embodiment, the third dielectric layer may include a different dielectric material as the second dielectric layer 110. In yet another embodiment, both the first dielectric layer 106 and the second dielectric layer 110 are made from a first material and the third dielectric layer 126 is made from a second material. In such cases, the respective barrier layers would be chosen based on their compatibility and function with the first material and the second material.

In an embodiment, the third dielectric layer 126 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. In some embodiments, a planarization technique such as, for example, chemical mechanical planarization (CMP) and/or grinding is applied after deposition. In other embodiments, no polishing or griding of the third dielectric layer 126 is performed, and the dielectric layer 126 is formed by selective deposition. In yet another embodiment, the third dielectric layer 126 may include a self-planarizing material such as a spin-on glass (SOG) or a spin-on low-K dielectric material. Doing so may avoid the need to perform a subsequent planarizing step.

The third dielectric layer 126 may have a typical thickness ranging from about 30 nm to about 100 nm and ranges there between, although a thickness less than 30 nm and greater than 100 nm are explicitly contemplated. It is noted the typical thickness of the is less than the typical thickness of a conventional dielectric layer deposited in the middle-of-line or back-end-of-line. For example, according to embodiments of the present invention, the typical thickness of the third dielectric layer 126 is approximately only 30% of the typical thickness of a conventional dielectric layer deposited in the middle-of-line or back-end-of-line. As such, for exemplary purposes only, if the typical thickness of a conventional dielectric layer deposited in the middle-of-line or back-end-of-line were approximately 100 nm, the typical thickness of the first dielectric layer 106, at this stage of fabrication, is approximately 30 nm. As such, the combined height or thickness of the first dielectric layer 106, the second dielectric layer 110, and the third dielectric layer 126 is approximately equal to the typical thickness of a conventional dielectric layer deposited in the middle-of-line or back-end-of-line. Each of the first dielectric layer 106, the second dielectric layer 110, and the third dielectric layer 126 do not have to have to be equal thicknesses. For example, it is explicitly contemplated for one of the dielectric layers, such as the first dielectric layer 106, to have a thickness less than either the second dielectric layer 110 or the third dielectric layer 124. Or in another example, either the second dielectric layer 110 or the third dielectric layer 124 has a thickness less than a thickness of the first dielectric layer 106. Finally, the second dielectric layer 110 may be thicker than the third dielectric layer 124, or vice versa.

The structure 100 includes multiple low resistance semiconductor interconnect structures 122 positioned adjacent, or next, to one another, and manufactured in a process flow. Embodiments of the present invention, and the detailed description provided above, are directed primarily at the physical shape or profile of the individual interconnect structures 122. For example, each low resistance semiconductor interconnect structure 122 represented by the structure 100 has a width which both increases and decreases relative to height. Said differently, each low resistance semiconductor interconnect structure 122 represented by the structure 100 is laterally wider in a middle portion as compared to a top or a bottom. As such, the low resistance semiconductor interconnect structures 122 each have a profile with both positive tapered sidewalls and negative tapered sidewalls.

As illustrated in FIG. 9, the low resistance semiconductor interconnect structures represented by the structure 100 have some distinctive notable features. For example, the interconnect structures are embedded in three separate dielectric layers and fabricated with only a single metal deposition resulting in a homogeneous, or congruent, interconnect structure 222 without unnecessary boundaries or interfaces which are otherwise prone to oxidation and increased resistance. Further, at the time of metal deposition, FIG. 5, the trenches 114 have a relatively low aspect ratio which enables (a) complete filling of the trench and low risk of void creation, and (b) greatly reduces the possibility for dielectric line wiggle.

Additionally, the critical dimension (width) of the final individual interconnect structures 122 is relatively larger than conventional structures thereby decreasing line resistance. In sum, the critical dimension the individual interconnect structures 122 represented by the structure 100 enable fabrication of low resistance structures in high densities without the conventional concerns of shorting, bridging or breaks caused by dielectric line wiggle.

To elaborate on the specific features of the interconnect structures disclosed herein reference will be made to different regions of the interconnect structures, for example a first region, a second region, and a third region. The first region generally refers to a portion of the interconnect structure aligned with the first dielectric layer 106, the second region generally refers to a portion of the individual interconnect structure 122 aligned with the second dielectric layer 110, and the third region generally refers to a portion of the interconnect structure aligned with the third dielectric layer 126.

With continued reference to FIG. 9, the first region, the second region and the third regions are arranged one above another. Further, the second region has a width which increases relative to height, the third region has a width which decreases relative to height and also has a region has a substantially uniform width relative to height. In general, the barrier layer (116, 124) separates the interconnect structure 122 from the dielectric layers (106, 112, 126). Specifically, the barrier layer may include a first barrier layer (116) separating the first region of the interconnect structure 222 from the first dielectric layer 126 and the second region of the interconnect structure 222 from the second dielectric layer 110, and a second barrier layer 124 separating the third region of the interconnect structure from the third dielectric layer 126. In some embodiments, as previously described above, the barrier layer (116, 122) can include at least two different materials. In all cases, an average width of both the second region and the third region is greater than a width of the first region.

Figure 10:
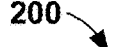
FIG. 10 is a cross-sectional view of a second structure shown during an intermediate step of fabrication, according to an embodiment of the invention.
Figure 10:
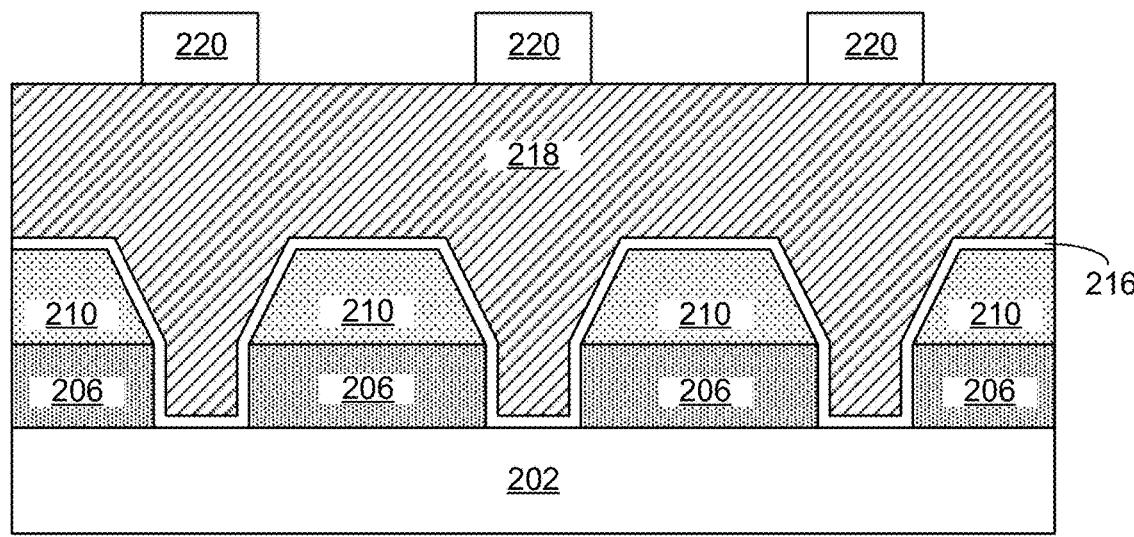

Referring now to FIG. 10, a structure 200 is shown during an intermediate step of a method of fabricating a transistor structure, according to an embodiment of the invention. The structure 200 may include a substrate 102, a first dielectric layer 206, a second dielectric layer 210, a first barrier layer 216, a conductive material 218 and a mask 220. The structure 200 may be formed or provided.

The structure 200 may be substantially similar to the structure 100 of the FIG. 5. Similarly named items of the structure 200 may be formed as described for similar named items of the structure 100.

Figure 11:
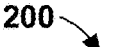
FIG. 11 is a cross-section view of the second structure illustrating formation of a spacer, according to an embodiment of the invention.
Figure 11:
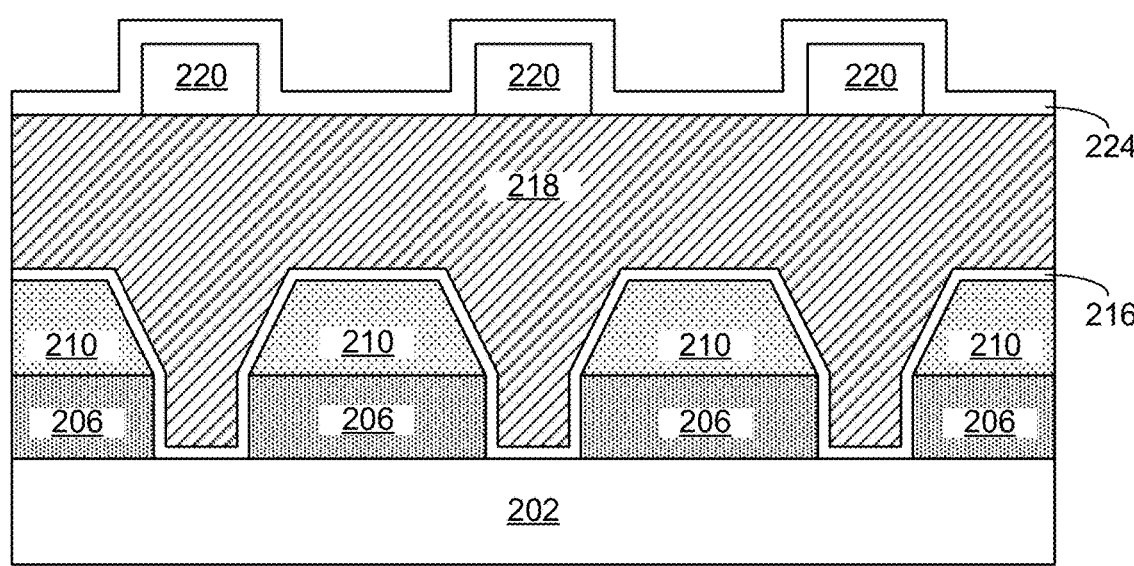

Referring now to FIG. 11, the structure 200 is shown according to an embodiment of the invention. A spacer 224 may be formed.

The spacer 224 may be formed conformally on the structure 200, on an upper horizontal surface of the conductive material 218, and on an upper horizontal surface and vertical side surfaces of the mask 220. The spacer 224 may include materials such as, for example, any dielectric material such as silicon nitride (SiN) and silicon nitride carbon (SiNC) and may include a single layer or may include multiple layers of dielectric material. The spacer 224 may be deposited using typical deposition techniques, for example, physical vapor deposition, atomic layer deposition, molecular layer deposition, and chemical vapor deposition. The spacer 224 may have a thickness between 3 nm and 30 nm, although thickness greater than 30 nm or less than 3 nm are acceptable. The spacer 224 is not used in the embodiment of the structure 100.

Figure 13:
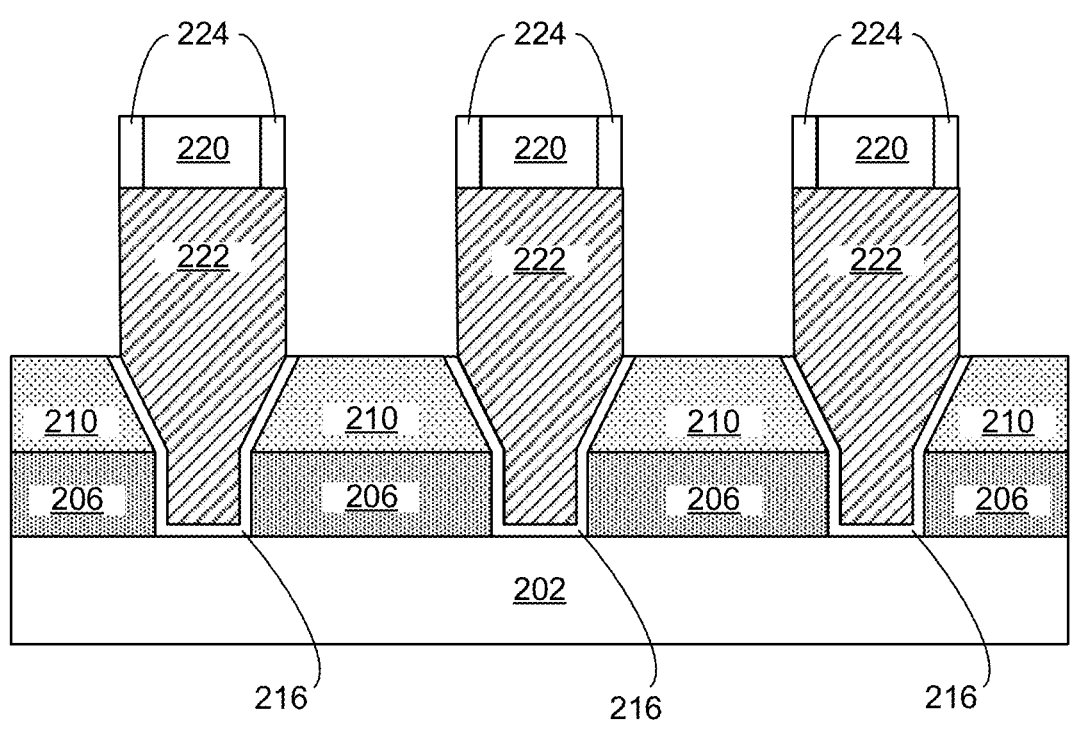
FIG. 13 is a cross-section view of the second structure illustrating patterning of a conductive material to form individual interconnect structures, and removal of portions of a first barrier layer, according to an embodiment of the invention.

The spacer 224 helps to protect portions of the conductive material 218 during subsequent patterning of the structure 200, specifically during the metal etch step as illustrated in FIG. 13.

Figure 12:
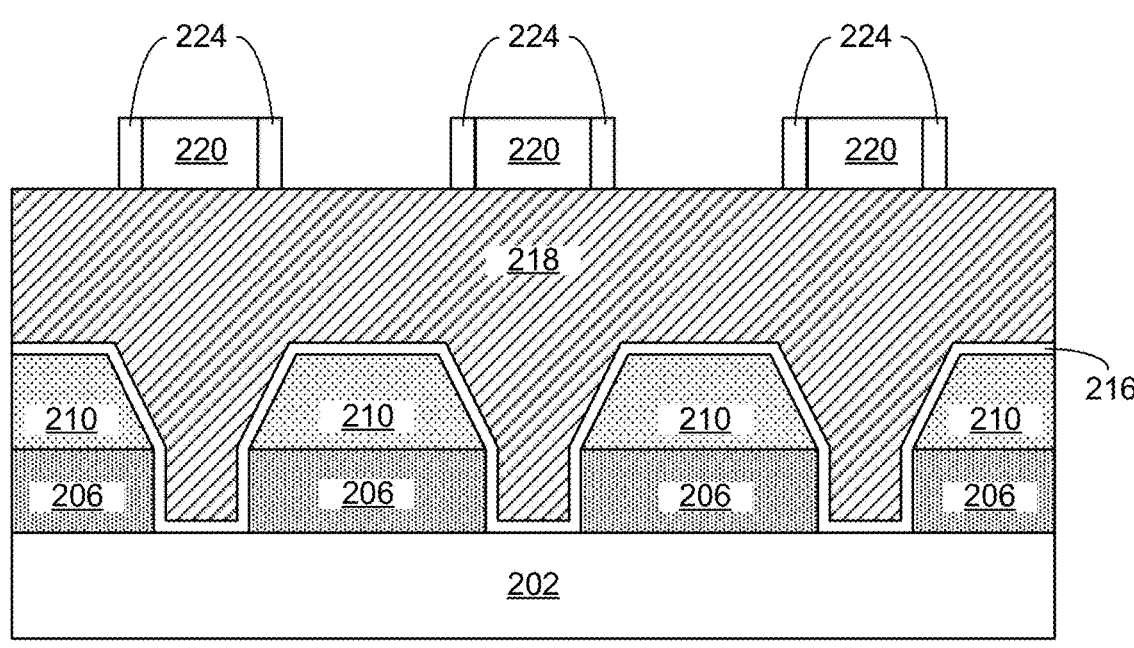
FIG. 12 is a cross-section view of the second structure illustrating removal of portions of the spacer, according to an embodiment of the invention.

Referring now to FIG. 12, the structure 200 is shown according to an embodiment. Portions of the spacer 224 may be removed.

The portions of the spacer 224 may be selectively removed from horizontal surfaces of the structure 200 using an anisotropic etching technique, such as, for example, reactive ion etching. The remaining portions of the spacer 224 may remain vertically aligned directly adjacent to the mask 220. The spacer 224 may be removed from upper horizontal surfaces of the mask 220 and the conductive material 218.

Referring now to FIG. 13, the structure 200 is shown according to an embodiment. Portions of the conductive material 218 are removed to form individual interconnect structures 222 from the conductive material 218. Portions of the first barrier layer 216 may be removed.

An etching technique is applied to generally remove portions of the conductive material 218 according to known techniques. Specifically, a suitable directional etching technique is used to etch exposed portions of the conductive material 218 and the first barrier layer 216, and expose topmost surfaces of the second dielectric layer 110 and the first barrier layer 216.

The portions of the conductive material 218 and the first barrier layer 216 may be removed which are vertically aligned with the lateral width of the spacer 224 surrounding the mask 220. Specifically, a directional or isotropic dry etching technique, such as reactive ion etching, is used to etch exposed portions of the second dielectric layer 210 and the first barrier layer 216. More specifically, the directional etching technique is applied to expose an upper horizontal surface of the second dielectric layer 210.

Figure 14:
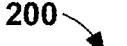
FIG. 14 is a cross-section view of the second structure illustrating deposition of a sacrificial material, according to an embodiment of the invention.
Figure 14:
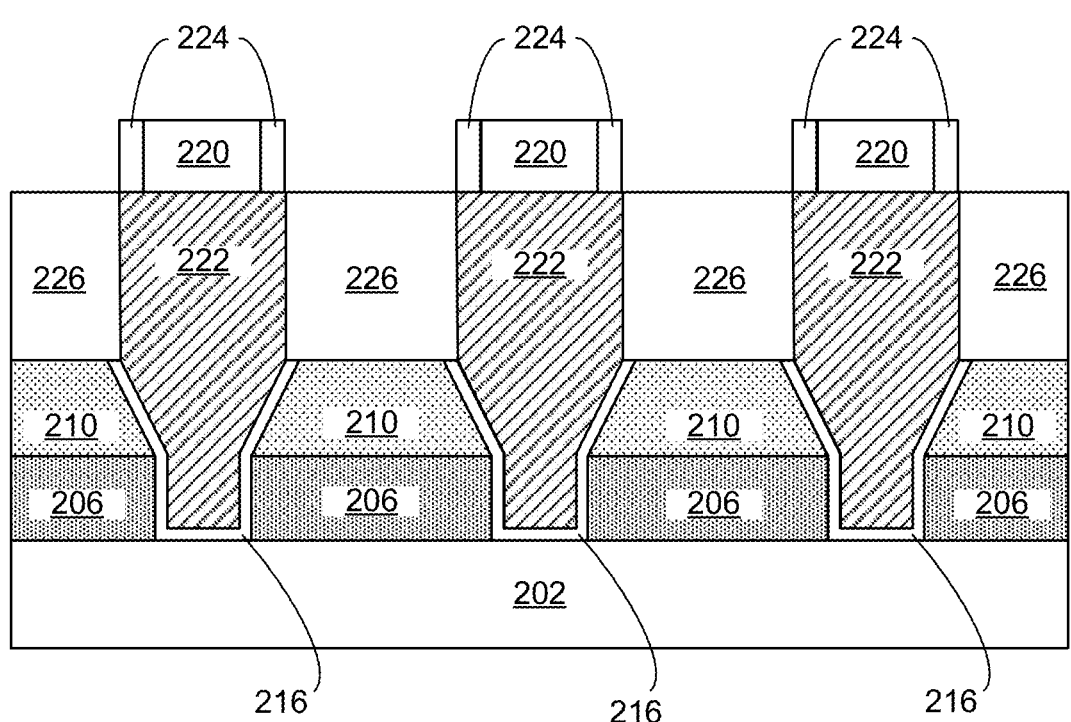

Referring now to FIG. 14, the structure 200 is shown according to an embodiment of the invention. A sacrificial material 226 may be deposited.

In an embodiment, the sacrificial material 226 is an organic planarization layer (OPL). In an embodiment, for example, the sacrificial material 226 can be an amorphous carbon layer. After depositing the sacrificial material 226, a selective etch may be performed using known techniques, until an upper horizontal surface of the sacrificial material 226 is aligned with an upper horizontal surface of the individual interconnect structures 222 and is aligned with lower horizontal surfaces of the mask 220 and the spacer 224.

Figure 15:
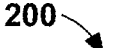
FIG. 15 is a cross-section view of the second structure illustrating removal of the spacer and removal of portions of the sacrificial material, according to an embodiment of the invention.
Figure 15:
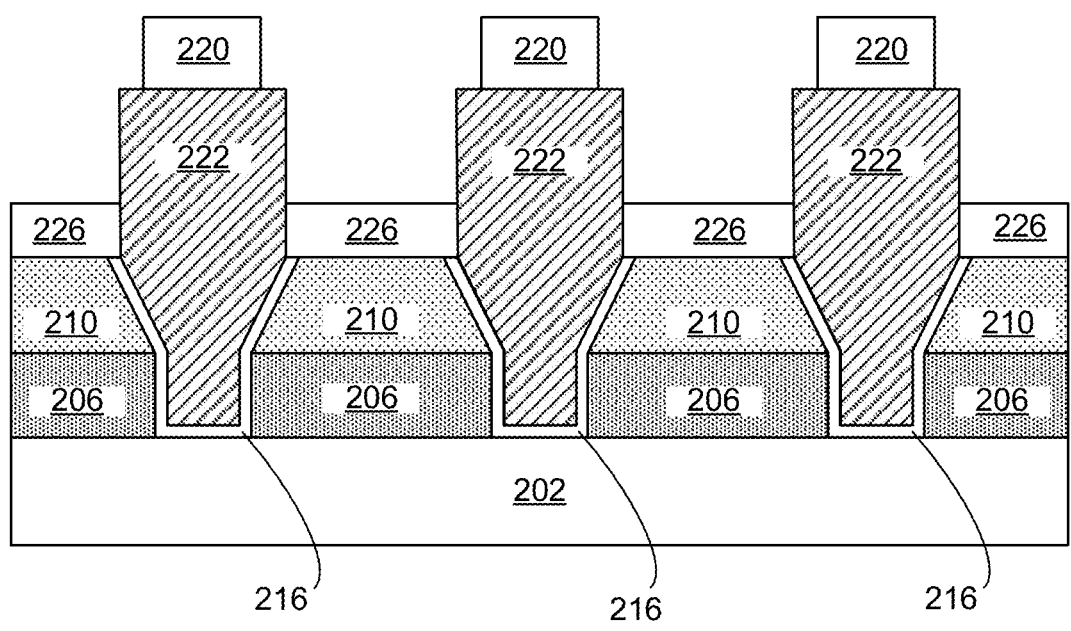

Referring now to FIG. 15, the structure 200 is shown according to an embodiment of the invention. The spacer 224 may be removed. Portions of the sacrificial material 226 may be removed.

A selective etch may be performed using known techniques, removing the spacer 224 and the portions of the sacrificial material 226. The selective etch may be selective to the mask 220 and the individual interconnect structures 222. A vertical side surface of the mask 220 may be exposed. A portion of a horizontal upper surface of the individual interconnect structure 222 may be exposed. A portion of a vertical side surface of the individual interconnect structures 222 may be exposed. A remaining portion of the sacrificial material 226 may remain on the second dielectric layer 210 and covering a remaining portion of the vertical side surface of the individual interconnect structures 222.

Figure 16:
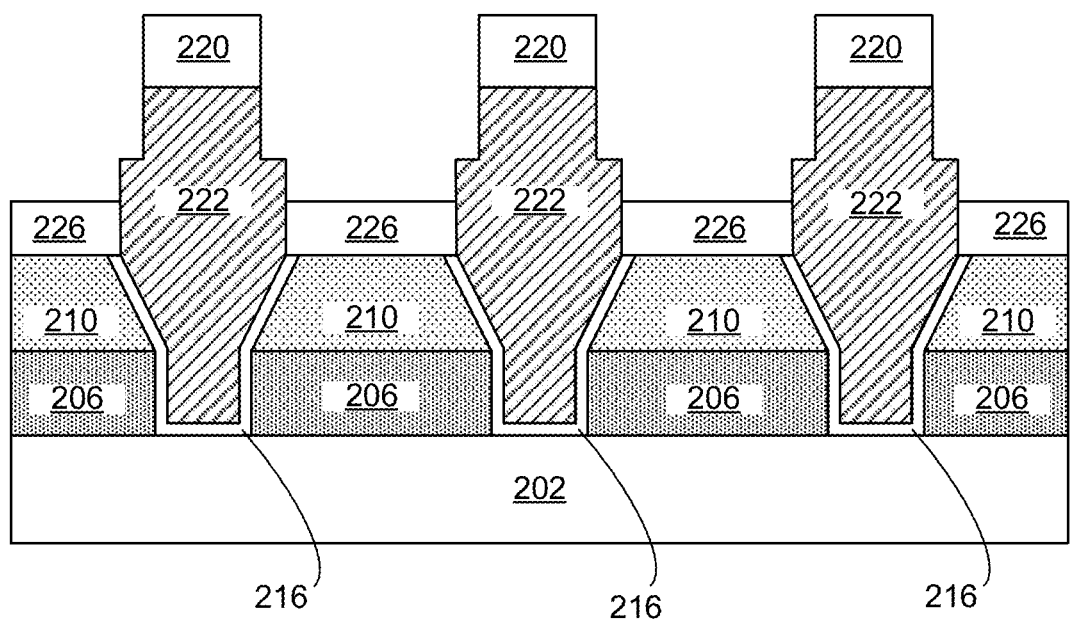
FIG. 16 is a cross-section view of the second structure illustrating removal of portions of the individual interconnect structures, according to an embodiment of the invention.

Referring now to FIG. 16, the structure 200 is shown according to an embodiment. Portions of the individual interconnect structures 222 may be removed.

An etching technique is applied to generally remove portions of the individual interconnect structures 222 according to known techniques. Specifically, a suitable directional etching technique is used to etch exposed portions of the individual interconnect structures 222 and expose a new lower upper horizontal surface of the individual interconnect structures 222.

Figure 17:
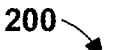
FIG. 17 is a cross-section view of the second structure illustrating removal of additional portions of the individual interconnect structures, removal of remaining portions of the sacrificial material and removal of a mask, according to an embodiment of the invention.
Figure 17:
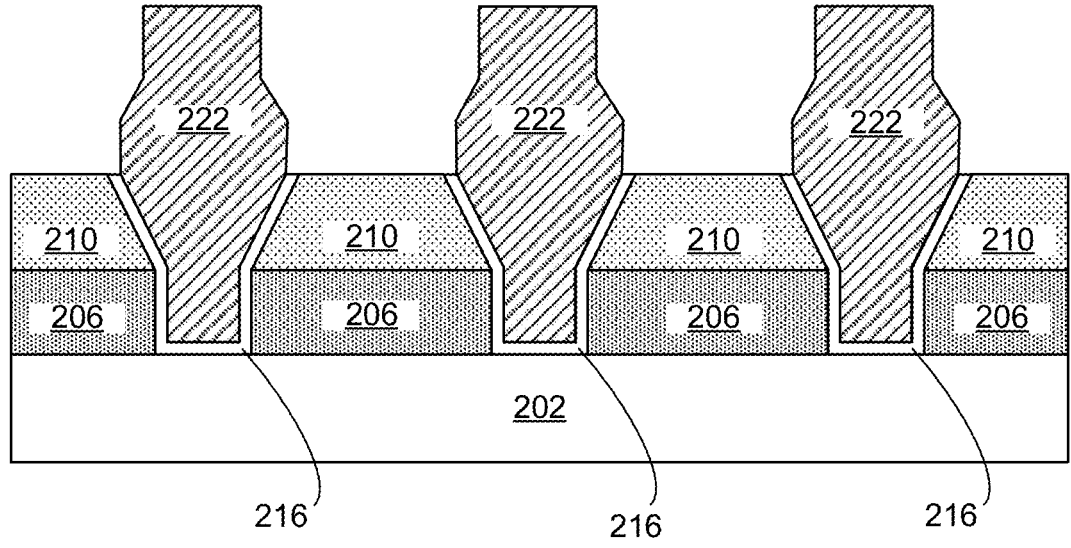

Referring now to FIG. 17, the structure 200 is shown according to an embodiment. Additional portions of the individual interconnect structures 222 are removed. The sacrificial material 226 may be removed. The mask 220 may be removed.

An etching technique is applied to generally remove additional portions of the individual interconnect structures 222 according to known techniques. Specifically, a suitable directional etching technique is used to etch exposed portions of the individual interconnect structures 222 selective to the mask 220 and the sacrificial material 226. The object of this directional etching technique is to form individual interconnect structures 222 having an upper portion with a negatively tapered profile. More specifically, the directional etching technique is applied at a very specific angle to create a very specific negative tapered profile in portions of the individual interconnect structures 222 remaining above the sacrificial material 226. Specifically, the portions of the conductive material 218 remaining above sacrificial material 226 with a negative tapered profile have a lateral width at, or about, the topmost surface of the sacrificial material 226 that is larger than a lateral width at a topmost surface of the individual interconnect structures 222, as illustrated. Said differently, a sidewall angle of the negative tapered profile may range from approximately −30 degrees to approximately −50 degrees. The negative tapered profile is carefully chosen to maximize a width at, or about, a middle of the individual interconnect structures 222 while also maintaining an acceptable distance between adjacent remaining portions of the individual interconnect structures 222.

Suitable directional etching techniques may include, but are not limited to: reactive ion etching (RIE), ion beam etching, plasma etching, or laser ablation. In an embodiment, a RIE technique using, for example, with or without including argon ion species, may be used to remove portions of the individual interconnect structures 222 as described above. In an alternative embodiment, an ion beam etching technique using, for example, at fixed ion beam angle corresponding to the desired taper angle of the structure, may be used to remove portions of the individual interconnect structures 222 as described above. In all cases, the directional etching technique shall be chosen and tailored to the specific material of the individual interconnect structures 222 in order to produce the desired negative tapered profile.

The sacrificial material 226 is protecting a center portion of the individual interconnect structure 222, which remains with an essentially straight side surface, or at a 90 degree angle above the substrate 202.

Remaining portions of the sacrificial material 226 are removed according to known techniques. For example, after etching the individual interconnect structures 222, the sacrificial material 226 is removed by resist stripping selective to the mask 220, the individual interconnect structure 222 and the second dielectric layer 210. An upper horizontal surface of the second dielectric layer 210 is exposed.

The mask 220 is removed according to known techniques. For example, after etching the sacrificial material 226, the mask 220 is then removed by resist stripping, exposing an upper horizontal surface of the interconnect structure 222. For purposes of the present description, the mask 220 is the same, or substantially similar, as the mask 212 previously described.

Figure 18:
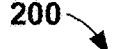
FIG. 18 is a cross-section view of the second structure and illustrates formation of a second barrier layer, according to an embodiment of the invention.
Figure 18:
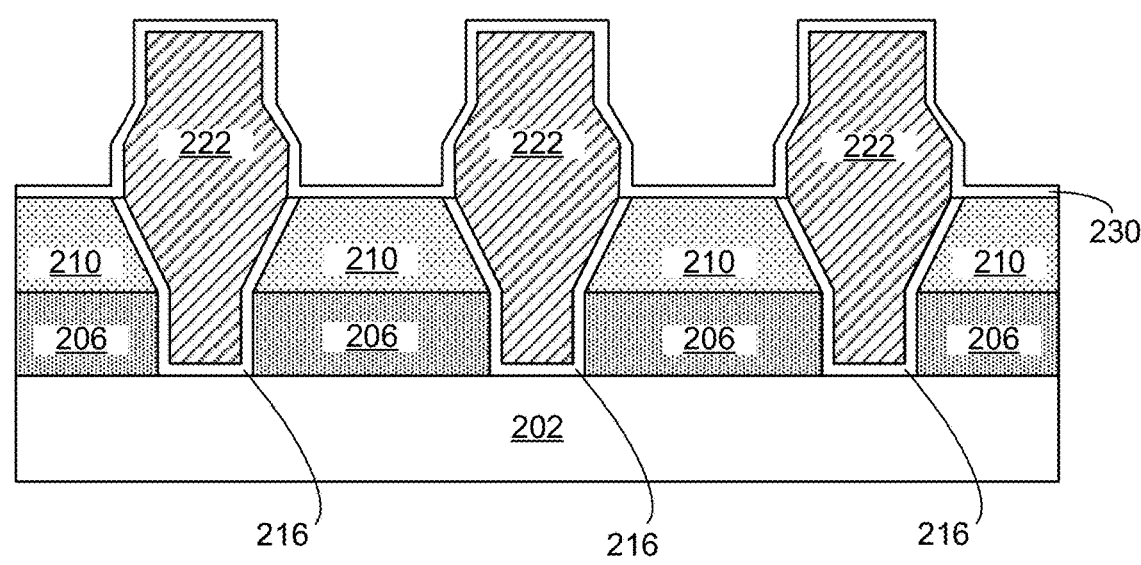

Referring now to FIG. 18, the structure 100 is shown according to an embodiment of the invention. A second barrier layer 230 may be formed.

The second barrier layer 230, or nucleation layer, is formed by conformally depositing a barrier material over the structure 200 according to known techniques. Specifically, the barrier material is conformally deposited on a top and on vertical and tapered sidewalls of the interconnect structures 222 and exposed topmost surfaces of the second dielectric layer 210 and the first barrier layer 216, as illustrated.

The second barrier layer 230 is applied to create a diffusion break between sidewall portions of subsequently formed dielectrics. As such, the second barrier layer 230 would be designed to prevent diffusion of the conductive material of the individual interconnect structures 222 into the subsequently formed dielectrics. According to embodiments of the present invention the second barrier layer 230 is composed of any known suitable barrier materials, for example, metal nitrides. In an embodiment, the second barrier layer 230 is titanium nitride (TiN), tungsten nitride (WN), tantalum nitride (TaN) boron carbon doped tungsten (WBC), or some combination thereof. In an embodiment, the second barrier layer 230 includes multiple layers for example a tantalum layer and a tantalum nitride layer. In another embodiment, the second barrier layer 230 includes a single layer of tungsten nitride (WN). In yet another embodiment, the first barrier layer 216 includes a single layer of titanium tungsten nitride (TiWN). Further, the second barrier layer 230 may be the same or different composition as the first barrier layer 216. In all cases, the barrier layers (216, 230) would preferably be chosen based on the specific surrounding materials of the dielectric layers (206, 210) and the conductive material 218.

In an embodiment, the second barrier layer 230 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In general, the second barrier layer 230 may have a thickness sufficient to achieve desired barrier properties as is well known to persons having skill in the art. For example, the second barrier layer 230 may have a typical thickness ranging from about 1 nm to about 4 nm and ranges there between, although a thickness less than 1 nm and greater than 4 nm are explicitly contemplated.

Figure 19:
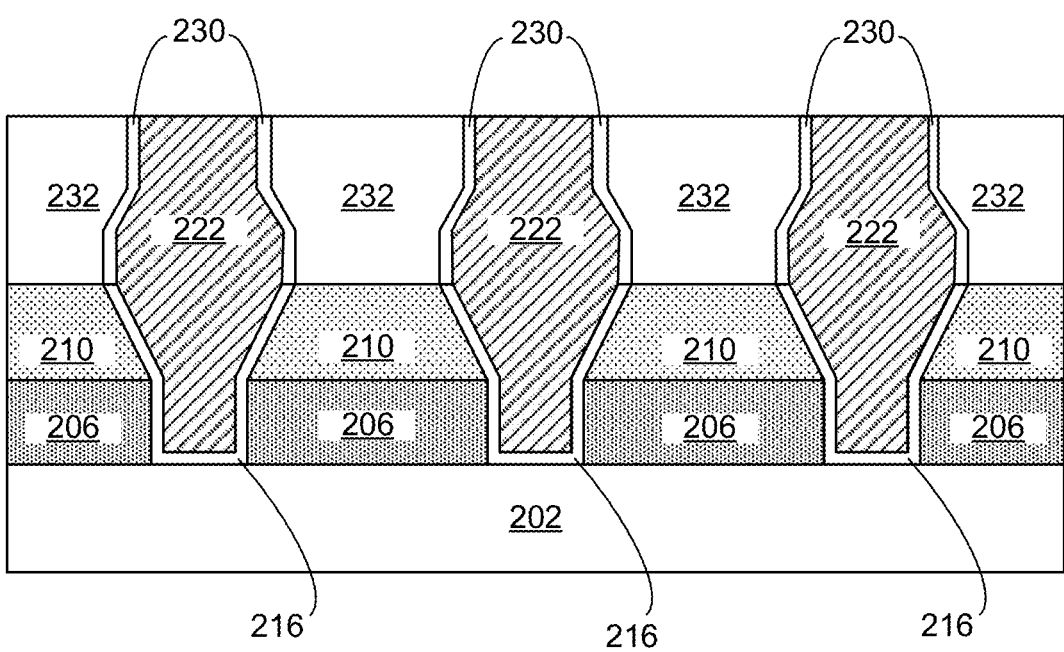
FIG. 19 is a cross-section view of the second structure and illustrates removal of portions of the second barrier layer and formation of a third dielectric layer, according to an embodiment of the invention.

Referring now to FIG. 19, the structure 200 is shown according to an embodiment of the invention. A portion of the second barrier layer 230 may be removed. A third dielectric layer 232 may be deposited.

An etching technique is applied to remove horizontal portions of the second barrier layer 124 according to known techniques. Specifically, one or more dry etching techniques is used to remove horizontal portions of the second barrier layer 230, as illustrated from upper horizontal surfaces of the individual interconnect structure 222 and the second dielectric layer 210. Suitable dry etching techniques may include, but are not limited to: reactive ion etching (RIE), ion beam etching, plasma etching, or laser ablation. In all cases, the dry etching technique shall cause remaining portions of the second barrier layer 230 on the vertical and negative tapered sidewalls of the individual interconnect structures 222.

The third dielectric layer 232 is deposited on the upper surface of the second dielectric layer 210 according to known techniques. According to embodiments of the present invention, the third dielectric layer 232 may include any dielectric material compatible with known deposition techniques, such as, but not limited to, the exemplary materials listed above with respect to the first dielectric layer 206. In an embodiment, the third dielectric layer 232 may include the same or similar dielectric material as the first dielectric layer 206, the second dielectric layer 210, or both. In an alternative embodiment, the third dielectric layer may include a different dielectric material as the second dielectric layer 210. In yet another embodiment, both the first dielectric layer 206 and the second dielectric layer 210 are made from a first material and the third dielectric layer 232 is made from a second material. In such cases, the respective barrier layers would be chosen based on their compatibility and function with the first material and the second material.

In an embodiment, the third dielectric layer 232 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. In some embodiments, a planarization technique such as, for example, chemical mechanical planarization (CMP) and/or grinding is applied after deposition. In other embodiments, no polishing or griding of the third dielectric layer 232 is performed. In yet another embodiment, the third dielectric layer 232 may include a self-planarizing material such as a spin-on glass (SOG) or a spin-on low-K dielectric material. Doing so may avoid the need to perform a subsequent planarizing step.

The third dielectric layer 232 may have a typical thickness ranging from about 30 nm to about 100 nm and ranges therebetween, although a thickness less than 30 nm and greater than 100 nm are explicitly contemplated. It is noted the typical thickness of the is less than the typical thickness of a conventional dielectric layer deposited in the middle-of-line or back-end-of-line. For example, according to embodiments of the present invention, the typical thickness of the third dielectric layer 232 is approximately only 30% of the typical thickness of a conventional dielectric layer deposited in the middle-of-line or back-end-of-line. As such, for exemplary purposes only, if the typical thickness of a conventional dielectric layer deposited in the middle-of-line or back-end-of-line were approximately 100 nm, the typical thickness of the first dielectric layer 206, at this stage of fabrication, is approximately 30 nm. As such, the combined height or thickness of the first dielectric layer 206, the second dielectric layer 210, and the third dielectric layer 232 is approximately equal to the typical thickness of a conventional dielectric layer deposited in the middle-of-line or back-end-of-line. Each of the first dielectric layer 206, the second dielectric layer 210, and the third dielectric layer 232 do not have to have to be equal thicknesses. For example, it is explicitly contemplated for one of the dielectric layers, such as the first dielectric layer 206, to have a thickness less than either the second dielectric layer 210 or the third dielectric layer 232. Or in another example, either the second dielectric layer 210 or the third dielectric layer 232 has a thickness less than a thickness of the first dielectric layer 206. Finally, the second dielectric layer 210 may be thicker than the third dielectric layer 232, or vice versa.

The structure 200 includes multiple low resistance semiconductor interconnect structures 222 positioned adjacent, or next, to one another, and manufactured in a process flow. Embodiments of the present invention, and the detailed description provided above, are directed primarily at the physical shape or profile of the individual interconnect structures 222. For example, each low resistance semiconductor interconnect structure 222 represented by the structure 200 has a width which both increases and decreases relative to height. Said differently, each low resistance semiconductor interconnect structure 222 represented by the structure 200 is laterally wider in a middle portion as compared to a top or a bottom. As such, the low resistance semiconductor interconnect structures 222 each have a profile with both positive tapered sidewalls and negative tapered sidewalls.

As illustrated in FIG. 19, the low resistance semiconductor interconnect structures 222 represented by the structure 200 have some distinctive notable features. For example, the individual interconnect structures 222 are embedded in three separate dielectric layers and fabricated with only a single metal deposition resulting in a homogeneous, or congruent, individual interconnect structure 222 without unnecessary boundaries or interfaces which are otherwise prone to oxidation and increased resistance. Further, at the time of metal deposition, FIG. 5, the trenches 114 have a relatively low aspect ratio which enables (a) complete filling of the trench and low risk of void creation, and (b) greatly reduces the possibility for dielectric line wiggle.

Additionally, the critical dimension (width) of the final interconnect structures is relatively larger than conventional structures thereby decreasing line resistance. In sum, the critical dimension the interconnect structures represented by the structure 200 enable fabrication of low resistance structures in high densities without the conventional concerns of shorting, bridging or breaks caused by dielectric line wiggle.

To elaborate on the specific features of the interconnect structures disclosed herein reference will be made to different regions of the interconnect structures, for example a first region, a second region, and a third region. The first region generally refers to a portion of the interconnect structure aligned with the first dielectric layer 206, the second region generally refers to a portion of the interconnect structure aligned with the second dielectric layer 210, and the third region generally refers to a portion of the interconnect structure aligned with the third dielectric layer 232.

With continued reference to FIG. 19, the first region, the second region and the third regions are arranged one above another. Further, the second region has three sections. A lower section of the second region has a substantially uniform with relative to a height which is a widest with of the individual interconnect structure. A middle section of the second region has a width which decreases relative to height. An upper section of the second region has a substantially uniform width relative to height. In general, the barrier layer (216, 230) separates the interconnect structure 222 from the dielectric layers (106, 112, 126). Specifically, the barrier layer may include a first barrier layer (216) separating the first region of the individual interconnect structure 222 from the first dielectric layer 206 and the second region of the individual interconnect structure 222 from the second dielectric layer 210, and a second barrier layer 230 separating the third region of the interconnect structure from the third dielectric layer 232. In some embodiments, as previously described above, the barrier layer (216, 230) can include at least two different materials. In all cases, an average width of both the second region and the third region is greater than a width of the first region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a homogeneous interconnect structure embedded in a dielectric layer, wherein the homogeneous interconnect structure comprises a third region vertically aligned above a second region vertically aligned above a first region;
   the third region comprises a first width at a topmost horizontal surface of the third region and a second width at a bottommost horizontal surface of the third region, wherein the first width is less than the second width, wherein at least a portion of the third region comprises a substantially uniform width relative to height;
   the second region comprises a third width at an upper horizontal surface of the second region and a fourth width at a lower horizontal surface of the second region, wherein the third width is greater than the fourth width; and a barrier layer comprising a first material and a second material, wherein only the first material separates the first region and the second region of the homogeneous interconnect structure from the dielectric layer, and wherein only the second material separates the third region of the homogeneous interconnect structure from the dielectric layer.

2. The semiconductor structure according to claim 1, further comprising:

a barrier layer separating the homogeneous interconnect structure from the dielectric layer.

3. The semiconductor structure according to claim 1, further comprising:

a barrier layer separating the homogeneous interconnect structure from the dielectric layer, wherein the barrier layer comprises a first portion made from a first material and a second portion made from a second material, wherein the first material is different from the second material.

4. The semiconductor structure according to claim 1, wherein the dielectric layer comprises at least two different dielectric materials.

5. The semiconductor structure according to claim 1, wherein the second width and the third width are substantially similar.

6. A semiconductor structure comprising:

a homogeneous interconnect structure embedded in a dielectric layer, wherein the homogeneous interconnect structure comprises a third region vertically aligned above a second region vertically aligned above a first region;

the third region comprises three sections: an upper section comprising a first width; a middle section comprising an upper horizontal surface comprising the first width and a lower horizontal surface comprising a second width; and a lower section comprising the second width; wherein the first width is less than the second width; and the second region comprises a third width at an upper horizontal surface of the second region and a fourth width at a lower horizontal surface of the second region, wherein the third width is greater than the fourth width.

7. The semiconductor structure according to claim 6, further comprising:

a barrier layer separating the homogeneous interconnect structure from the dielectric layer.

8. The semiconductor structure according to claim 6, further comprising:

a barrier layer separating the homogeneous interconnect structure from the dielectric layer, wherein the barrier layer comprises at least two different materials.

9. The semiconductor structure according to claim 6, further comprising:

a barrier layer comprising a first portion and a second portion, wherein the first portion separates both the first region and the second region from the dielectric layer, and wherein the second portion separates the third region from the dielectric layer, wherein the first portion of the barrier layer is made from a different material than the second portion of the barrier layer.

10. The semiconductor structure according to claim 6, wherein the dielectric layer comprises at least two different dielectric materials.

11. The semiconductor structure according to claim 6, wherein the second width and the third width are substantially similar.

12. The semiconductor structure according to claim 6, wherein an average width of the second region and the third region is greater than a width of the first region.

13. A semiconductor structure comprising:

a set of homogeneous interconnect structures embedded in a dielectric layer with a pitch less than 30 nm, wherein the set of homogeneous interconnect structures each comprise a third region vertically aligned above a second region vertically aligned above a first region;

the third region comprises a first width at an upper horizontal surface of the third region and a second width at a lower horizontal surface of the third region, wherein the first width is less than the second width; and the second region comprises a third width at an upper horizontal surface of the second region and a fourth width at a lower horizontal surface of the second region, wherein the third width is greater than the fourth width.

14. The semiconductor structure according to claim 13, further comprising:

a barrier layer separating the set of homogeneous interconnect structures from the dielectric layer.

15. The semiconductor structure according to claim 13, further comprising:

a barrier layer separating the set of homogeneous interconnect structures from the dielectric layer, wherein the barrier layer comprises at least two different materials.

16. The semiconductor structure according to claim 13, further comprising:

a barrier layer comprising a first material and a second material, wherein the first material separates both the first region and the second region from the dielectric layer, and wherein the second material separates the third region from the dielectric layer.

17. The semiconductor structure according to claim 13, wherein the dielectric layer comprises at least two different dielectric materials.

18. The semiconductor structure according to claim 13, wherein the second width and the third width are substantially similar.

19. The semiconductor structure according to claim 13, wherein an average width of the first region and the second region is greater than a width of the third region.

* * * * *